(12) United States Patent
Li et al.

(10) Patent No.: US 11,347,585 B2
(45) Date of Patent: May 31, 2022

(54) COMPRESSION METHOD FOR DEFECT VISIBILITY IN A MEMORY DEVICE

(71) Applicant: Micron Technology, Inc., Boise, ID (US)

(72) Inventors: Jiyun Li, Boise, ID (US); Johnathan L. Gossi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/926,559

(22) Filed: Jul. 10, 2020

(65) Prior Publication Data

US 2022/0012125 A1 Jan. 13, 2022

(51) Int. Cl.
*G06F 11/00* (2006.01)
*G06F 11/10* (2006.01)
*G06F 11/07* (2006.01)
*G11C 29/10* (2006.01)
*G06F 11/30* (2006.01)

(52) U.S. Cl.
CPC ...... *G06F 11/1068* (2013.01); *G06F 11/0772* (2013.01); *G06F 11/0787* (2013.01); *G06F 11/0793* (2013.01); *G06F 11/3037* (2013.01); *G11C 29/10* (2013.01)

(58) Field of Classification Search
CPC ............... G06F 11/073; G06F 11/1048; G06F 11/0751; G06F 11/0793; G06F 11/1016; G06F 11/102; G06F 11/1061
See application file for complete search history.

(56) References Cited

U.S. PATENT DOCUMENTS

| 7,200,793 | B1* | 4/2007 | Kengeri | G06F 11/1064 |
| | | | | 702/117 |
| 2004/0109370 | A1* | 6/2004 | Gappisch | G11C 29/38 |
| | | | | 365/201 |
| 2020/0194093 | A1* | 6/2020 | Chen | G11C 29/74 |

* cited by examiner

*Primary Examiner* — Charles Ehne
(74) *Attorney, Agent, or Firm* — Holland & Hart LLP

(57) ABSTRACT

Methods, systems, and devices for a compression method for defect visibility in a memory device are described. A memory device may identify one or more errors associated with a set of memory cells of a memory array in the device based on a first set of data associated with the first set of memory cells. The memory device may generate an indication of a location of the one or more errors in the first set of memory cells and compress the first set of data to generate an error flag based on identifying the one or more errors. The memory device may output the error flag and the indication of the location based on generating the error flag and the indication.

19 Claims, 8 Drawing Sheets

COMPRESSION METHOD FOR DEFECT VISIBILITY IN A MEMORY DEVICE

BACKGROUND

The following relates generally to one or more systems for memory and more specifically to compression method for defect visibility in a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
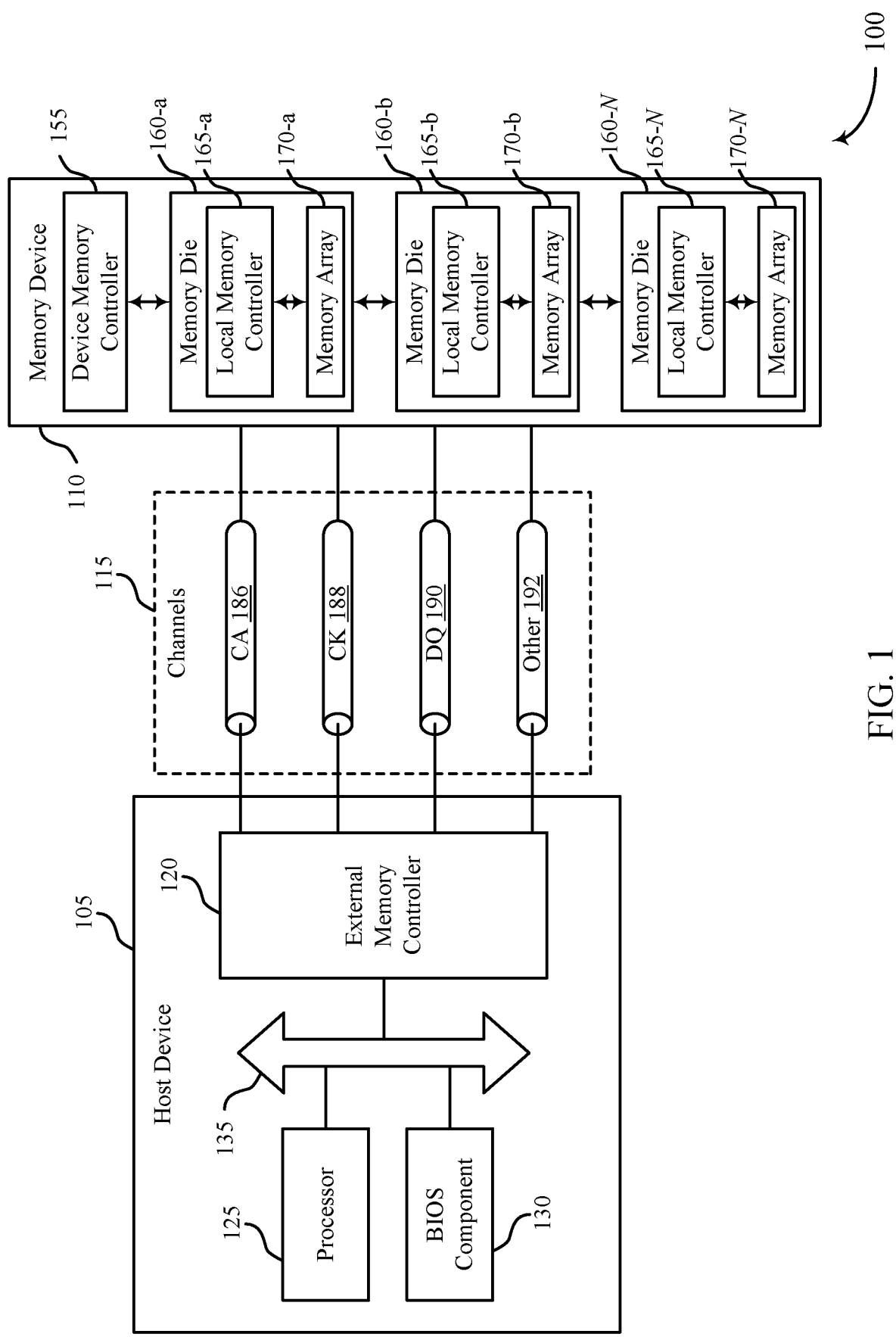
FIG. 1 illustrates an example of a system that supports a compression method for defect visibility in a memory device in accordance with examples as disclosed herein.

During manufacturing of a memory device, the memory device may be tested for electrical defects and or errors, such as shorts between various components (e.g., shorts between access lines, shorts between memory cells, or shorts between other components), for quality control purposes or as part of the design process. The memory device may initiate test operations on memory cells in the memory device and output the test data to one or more testers. The tester may receive the test data and generate reports or repair solutions. The reports generated by the tester may be used to repair memory devices, verify or refine memory device designs, or verify or refine fabrication processes, or a combination thereof. As the size of arrays of memory cells in the memory device has increased, the amount of test data generated by the test operations has also increased. In some examples, the tester may be incapable of receiving or storing such large amounts of test data. In some cases, communicating or storing such data may be prohibitive to the testing process. For example, due to the relatively large amount of test data generated, the time to perform a testing operation may be undesirably long. In such cases, the memory device may compress the test data generated during the test operation before outputting the test data to the tester. Some compression methods or techniques may cause a loss of information. For example, in some cases, the compressed test data may fail to indicate a location of an error that occurred during the test operation. The loss of information may decrease the effectiveness of the test operations performed and increase the difficulty to verify or refine memory device designs or fabrication processes.

Systems, devices, and techniques are described herein for compressing test data generated as part of a test operation of a memory device and for indicating a location of one or more errors identified as part of the test operation. The memory device may include a plurality of column planes, each having a set of memory cells arranged in a plurality of columns and rows in a memory array. The memory device may identify one or more errors (e.g., defects or shorts) associated with the set of memory cells by comparing a first column of a column plane with a second column of the column plane to generate test data during a test operation. The memory device may compress the test data to generate an error flag. That is, the error flag may represent a single bit of data that indicates whether an error occurred in the set of memory cells tested, where the error flag is generated by compressing the test data. Additionally, the memory device may also generate an indication of a location of the one or more errors in the set of memory cells based on the comparison. In some examples, the memory device may encode the indication of the location to reduce the size of the generated test data. After performing the test operation, the memory device may output the error flag and the indication of the location to a tester. Including the error flag and the indication of the location of the one or more errors may reduce the size of data outputted to the tester while reducing the loss of information due to the compression. This may also increase the ability to verify or refine memory device designs or fabrication processes.

Features of the disclosure are initially described in the context of systems and dies as described with reference to FIG. 1. Features of the disclosure are described in the context of process flow diagrams and testing setups as described with reference to FIGS. 2-4. These and other features of the disclosure are further illustrated by and described with reference to apparatus diagrams and flowcharts that relate to compression method for defect visibility in a memory device as described with reference to FIGS. 5-8.

FIG. 1 illustrates an example of a system 100 that supports a compression method for defect visibility in a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. In some examples, each memory array 170 may include one or more column planes for a testing. When testing a column plane, data associated with the memory cells (e.g., a set of data) may be read and compressed to generate an error flag and an indication of the location of the one or more errors. The compressed data may indicate whether an error occurred during the testing operation.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, memory device 110 may undergo a testing operation to identify one or more defects in a memory array. In some cases, the testing operation may occur as part of a manufacturing process of the memory device 110. During the testing operation, the memory device 110 may be coupled with a tester (e.g., a tester 205 as described with reference to FIG. 2). The tester may initiate tests on individual column planes of the memory array 170 during a respective testing operation. In some examples, the size of the memory array 170 may be relatively large. In such cases, the memory device 110 may generate relatively large amounts of test data. In some examples, the tester may be incapable of receiving or storing the large amount of test data (e.g., the test data would exceed the storage capacity of the tester). In other examples, the time to generate, communicate, or store the test data may be undesirably long. To reduce the size of the test data, the memory device 110 may compress the test data. In such cases, the compression scheme may cause a loss of information. This may reduce the effectiveness of the test operation.

The memory device 110 may compress the test data and generate an error flag and an indication of a location of one or more errors detected during the testing operation. The memory device may generate the indication and the error flag by identifying the location of the error in the memory array 170. In some examples, the memory device 110 may generate the error flag by compressing the test data generated at the memory array 170. The memory device 110 may then output the error flag and the indication to the tester. The compression of the test data may reduce the amount of data outputted to the tester while the indication of the location may increase the effectiveness of the test operation. That is, the tester may use the indication of the location to generate error reports to verify or refine memory device designs or fabrication processes.

Figure 2:
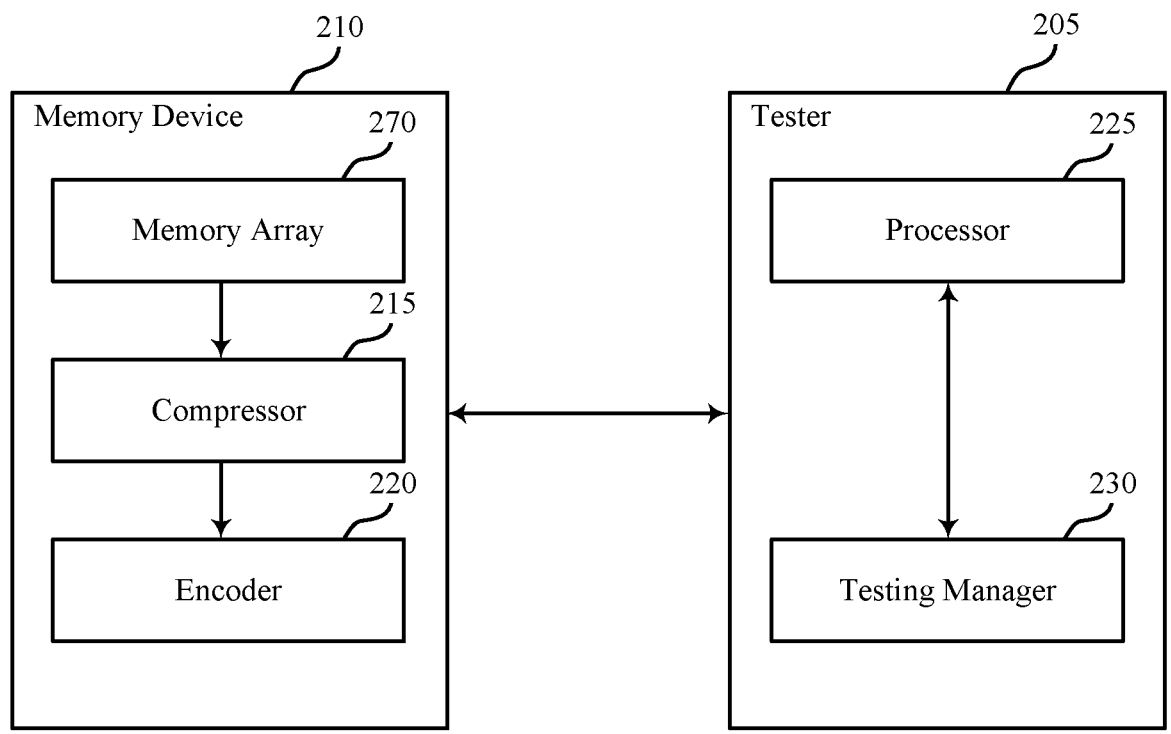
FIG. 2 illustrates an example of a testing setup that supports a compression method for defect visibility in a memory device in accordance with examples as disclosed herein.

FIG. 2 illustrates an example of testing setup 200 that supports a compression method for defect visibility in a memory device. Testing setup 200 may include a tester 205 being coupled with a memory device 210. The memory device 210 may be an example of memory device 110 as described with reference to FIG. 1. The memory device 210 may include memory array 270 (e.g., memory array 170 as described with reference to FIG. 1), compressor 215, and encoder 220. The tester 205 may include processor 225 and testing manager 230. In some cases, the methods as disclosed herein may be performed during a testing operation of the memory device 210. The tester 205 may be configured to initiate the test operation by sending a command to the memory device 210.

The memory device 210 may be configured to receive the command from the tester 205 and perform a test operation at the memory array 270. Memory array 270 may include one or more column planes, and each column plane may include rows and columns of individual memory cells. A column plane in memory array 270 may be associated with a set of memory cells that may be tested during the test operation. In some examples, during the test operation, the memory device 210 may be configured to select a column plane for testing based on the command received from the tester 205. That is, the tester 205 may initiate one or more internal read operations to test one or more column planes of the memory array 270. The memory device 210 may read the test data out of the column plane selected and send the test data to the compressor 215.

The compressor 215 may be configured to compress the test data generated from the memory array 270. In some examples, the compressor 215 may include a logic circuit configured to compress the test data. For example, the compressor 215 may include exclusive OR gates (e.g., XOR gates). Test data from a first column of the column plane selected may be compared with a second column of the column plane selected. The memory device 210 may be configured to identify one or more errors associated with the set of memory cells being tested based on the comparison. The compressor 215 may be configured to generate a series of bits that indicates whether an error occurred during a testing operation of a respective column plane index value. The compressor 215 may output the compressed data and the comparison results (e.g., the test data) to the encoder 220. Encoder 220 may be configured to encode some aspects of the test data received from the compressor 215 as described with reference to FIG. 3. For example, the encoder 220 may be configured to generate a location of one or more errors identified by the testing data. The memory device 210 may read out the resulting encoded test data (e.g., as a burst) to the tester 205.

Tester 205 may be configured to receive the compressed/encoded test data from the memory device 210 at the processor 225. The processor 225 may be configured to store test data associated with new errors in the memory device 210. In some examples, the processor 225 may be configured to refrain from storing test data associated with errors already stored in the processor 225. For example, a first column plane may be tested one or more times and the memory device 210 may identify the same error in the set of memory cells multiple times. The processor 225 may store the first identification of the error received from the memory device 210 and refrain from storing the additional identifications of the same error. The processor 225 may also be configured to output the stored test data to the testing manager 230.

The testing manager 230 may be configured to determine how to correct any detected errors in the memory array. In some examples, the testing manager 230 may be configured to repair one or more portions of the memory array 270 by generating a repair solution. In other examples, the testing manager 230 may be configured to generate error reports that refine memory device designs or fabrication processes to reduce errors in subsequent manufacturing of the memory device 210.

In some examples, the size of the memory array 270 may be relatively large. In such cases, the amount of test data generated may also be relatively large. For example, the amount of test data generated by a test operation performed at the memory array 270 may exceed the storage capacity of the processor 225. This may cause the test to fail and the test operation may not yield usable data. In other examples, the time used to perform a testing operation may be undesirably long. To reduce the size of the test data outputted to the tester, the memory device 210 may implement a compression scheme or method and compress the data at the compressor 215. In some examples, the compression may result in a loss of information. This may reduce the effectiveness of the test operation.

Techniques are described herein for compressing test data generated at the memory device 210 to reduce the amount of data communicated to and stored at the tester 205. Such techniques may reduce the latency of the testing operation and reduce a likelihood of exceeding the storage capacity of the tester 205. Additionally or alternatively, the memory device 210 may output an error flag and an indication of the location of the one or more errors at the memory array 270 to the tester 205. That is, the memory device 210 may identify one or more errors associated with a first set of memory cells in the memory array 270, generate an indication of the location of the one or more errors, and compress the test data of the first set of memory cells to generate an error flag. Such techniques may reduce the loss of information due to compression at the compressor 215 and may yield other advantages.

Figure 3:
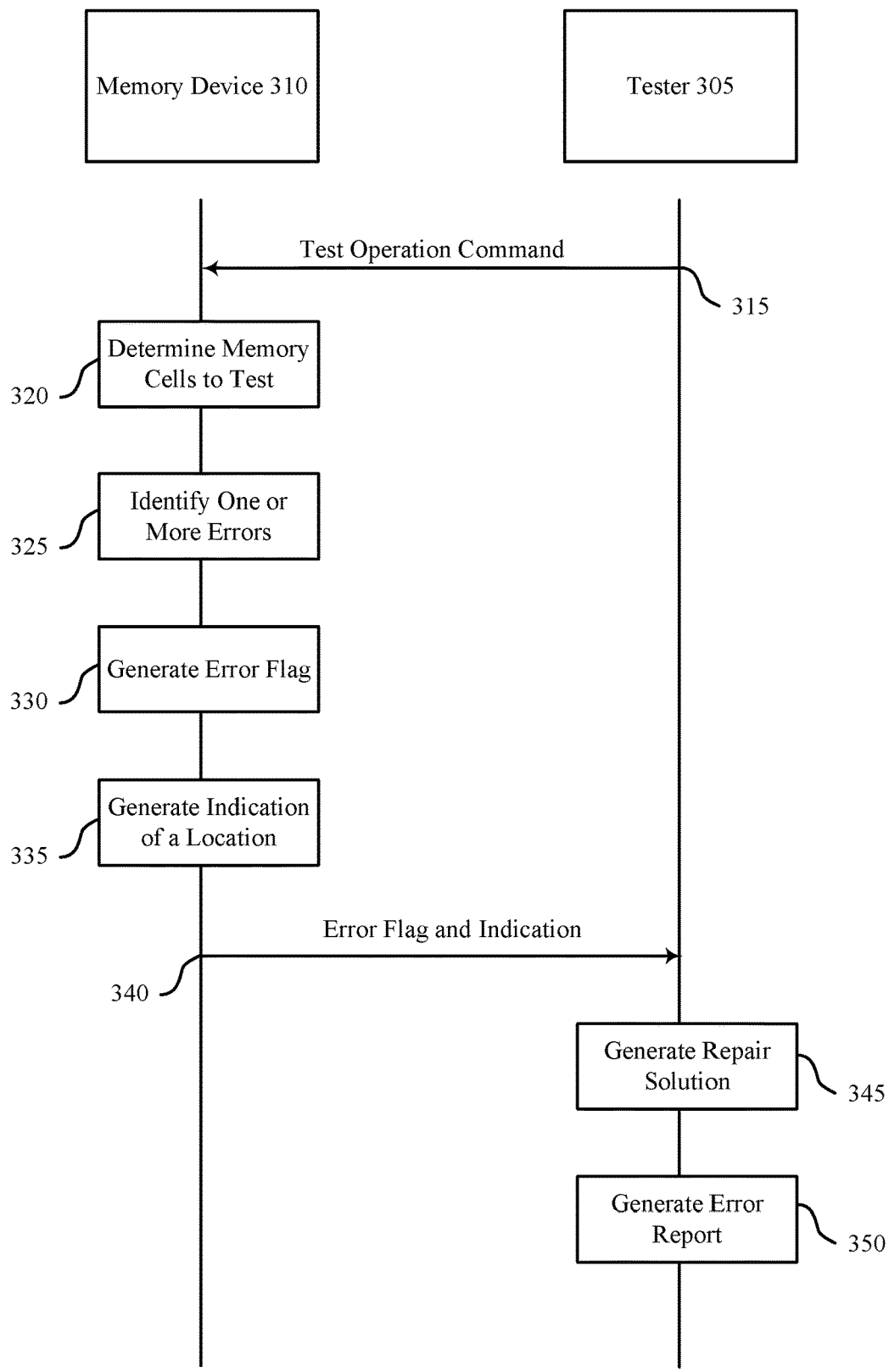
FIG. 3 illustrates an example of a process flow diagram that supports a compression method for defect visibility in a memory device in accordance with examples as disclosed herein.

FIG. 3 illustrates a process flow diagram 300 that supports a compression method for defect visibility in a memory device in accordance with examples as disclosed herein. The process flow diagram 300 may be performed by a system or its components as described herein. For example, the method of the process flow diagram 300 may be performed by a system with reference to FIGS. 1 and 2. The process flow diagram 300 may be performed by a tester 305 and a memory device 310. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible.

The tester 305 may initiate a testing operation at the memory device 310 during the manufacturing process to detect electrical defects and errors. For example, the memory device 310 may be tested to detect defective memory cells or memory cells that have been shorted together. In some examples, the memory device 310 may output the test data to the tester 305 after performing the test operation. In some cases, the memory device 310 may have relatively large memory arrays (e.g., memory array 270 as described with reference to FIG. 2) and may cause a relatively large amount of test data to be generated. In such cases, the tester 305 may be unable to receive the large amount of test data. That is, as described with reference to FIG. 2 and herein, the tester 305 may have a limited storage capacity and may be incapable of or it may be prohibitive to store all of the test data generated at the same time. This may cause the test operation to fail and yield unusable data. In other examples, the large amounts of test data may cause the time to perform the test operation to be undesirably long.

In some examples, the memory device 310 may reduce the size of the test data outputted to the tester 305 by compressing the test data generated using a compression method. Some compression methods may cause a loss of information. For example, the memory device 310 may compress the test data into a single bit that indicates whether an error occurred in a tested location of the memory during the test operation. In such cases, the compression of data may reduce a testers ability to determine where an error occurred or how many errors occurred. Consequently, there may be trade-off between data compression and quality of test data. For example, the single bit may indicate that an error occurred in a column plane that is tested but fail to give a specific column location. Additionally or alternatively, the single bit may fail to indicate the type of error that occurred. For example, the memory device 310 may have a single bit error or a double bit error (e.g., a multi-bit error). In some examples, a double bit error may occur when two access lines or two memory cells are shorted together and thus both access lines or memory cells are corrupted. The compressed test data may fail to indicate the double bit error as it indicates only if one or more errors occurred. Thus, generating a single bit during the compression scheme that fails to indicate a location or the type of error may cause information to be lost and make the test operation less effective. That is, it may be more difficult for the tester 305 to generate reports that refine and verify the memory device design or fabrication process with the loss of information. Such compression techniques may result in the over-repairing of a memory device during manufacturing, which may cause reduce yields of memory devices during the manufacturing process.

The memory device 310 may compress the test data and include an indication of the location. That is, the memory device 310 may identify one or more errors in the memory array. The memory device 310 may also identify one or more locations associated with the one or more errors. In some examples, the memory device 310 may use the identified locations to generate an indication of a location of the one or more errors. The memory device 310 may also compress the test data and generate an error flag that may indicate whether an error occurred during the test operation. Including the indication of the location may also allow the tester 305 to determine the type of error that occurred (e.g., a single bit or double bit error). In such cases, the tester 305 may be able to more effectively generate reports to increase the ability to verify or refine memory device designs or fabrication processes.

At 315, a test operation command may be received. For example, the tester 305 may initiate a test operation at the memory device 310 by sending a test operation command to the memory device 310. In some examples, the tester 305 may initiate the test operation during the manufacturing process of the memory device 310. The memory device 310 may be tested to identify electrical defects or errors. For example, the memory device 310 may be tested to identify unintended conduction paths (e.g., shorts or leakages) or disconnects (e.g., opens). Having such errors in the memory device 310 may cause the memory cells to be defective or corrupt. That is, the memory cells may fail to retain a logic state that is written to the memory cell. For example, the memory device 310 may write a logic state 0 to a memory cell. In some examples where the memory device 310 includes electrical defects and errors, when the memory device 310 performs a read of the memory cell, the memory device 310 may read a logic state 1 rather than a logic state 0 due to the errors. To repair these errors, the tester 305 may initiate the testing operation.

At 320, the memory cells to be tested may be determined. For example, the memory device 310 may receive the test operation command and initiate a test operation. As described with reference to FIG. 1 and disclosed herein, the memory device 310 may have a memory array that includes one or more column planes, and each column plane may include rows and columns of individual memory cells. The memory device 310 may test a set of memory cells in a column plane during the test operation. In some cases, to perform the test operation, the memory device 310 may identify a plurality of memory addresses associated with the test operation. That is, the memory device 310 may identify a first subset of data in the set of memory cells (e.g., a first column of the column plane) and a second subset of data in the set of memory cells (e.g., a second column of the column plane) to test based on the plurality of memory addresses associated with the testing operation. In some examples, the memory device 310 may have adjacent columns in the column plane that have similar electrical defects or errors. In such cases, the memory device 310 may be unable to detect the errors of the adjacent columns or the errors of the adjacent columns may cause further issues. In some examples, the memory device 310 may scramble the plurality of memory addresses to ensure non-adjacent columns (e.g., columns that are separated from one another by one or more additional columns) are selected during the test operation. The memory device 310 may repeat the identification and scrambling of the plurality of memory addresses associated with the test operation until each column (e.g., subset of data) in the column plane is selected.

At 325, one or more errors may be identified. For example, the memory device 310 may identify one or more errors in tested portion of the memory array after determining which set of memory cells are to be tested. In some examples, the memory device 310 may identify the one or more errors by writing the same logic state to each memory cell in the set of memory cells before testing the memory cells. That is, the set of memory cells in the memory device 310 may be associated with a first set of data (e.g., each memory cell in the array may be written to a logic state 0). A compressor (e.g., the compressor 215 as described with reference to FIG. 2) may then compare each subset of data (e.g., a column of memory cells) of the column plane with another subset of data in the column plane. For example, the compressor may compare a first subset of data in the column plane with a second subset of data in the column plane. In some examples, the compressor performs the comparison by comparing a first bit at a first bit location of the first subset of data with a second bit at the first bit location of the subset of data. That is, a logic state stored in a first memory cell of a first column may be compared with a second logic state stored in the first memory cell of the second column. The compressor may perform the comparison by implementing logic circuits. In some examples, the compressor may implement XOR logic gates to compare each bit location. The XOR logic gate may be configured to generate a comparison bit that indicates whether the first bit of the first subset of data is different than the second bit of the second subset of data. That is, the XOR logic gate may generate a comparison bit having a logic value one (1) when the first logic state of the first memory cell in the first column is different than the second logic state of the first memory cell of the second column. The XOR logic gate may generate comparison bits as described herein until each bit location of the first subset of data is tested with a corresponding bit location of the second subset of data in the column plane during the test operation.

At 330, an error flag may be generated. For example, the memory device 310 may generate an error flag by implementing the compressor. The compressor may compress the comparison bits (e.g., test data) generated by the memory device 310 during the test operation. The compressor may implement additional XOR logic gate circuits to compare the comparison bits generated. In some examples, the compressor may compare a first comparison bit at the first bit location with a second comparison bit at a second bit location. That is, the compressor may compare the comparison results of the first memory cells in the first and second columns with a comparison result of the second memory cells in the first and second columns (e.g., the second memory cell of the first column may be compared with a second memory cell of the second column to generate the second comparison bit). In some examples, the XOR logic gate may generate a compressed bit that indicates whether there was a difference in either the first bit location comparison or the second bit location comparison. In some cases, the compressor may implement additional XOR logic gates until the comparison bits are compressed into a single bit that indicates whether any bit location of the first subset of data is different than any bit location of the second subset of data. In such cases, the single bit may be referred to as an error flag. The memory device 310 may compress the test data to generate the error flag to indicate whether one or more errors occurred (e.g., whether there was at least one difference in the bit locations of the first subset of data compared with the second subset of data).

At 335, an indication of a location may be generated. For example, the memory device 310 may generate the indication of the location of the one or more errors detected during the comparison performed. In some examples, the memory device 310 may identify the memory addresses associated with the one or more errors. That is, the memory device 310 may determine the memory addresses of the memory cells having an error during the test operation. In such cases, the memory device 310 may identify that the error occurred at a specific bit location of the portion of the memory array that was tested. For example, the memory device 310 may identify a memory address associated with an error at the first bit location (e.g., the first memory cell of the first column). In some examples, the memory device 310 may identify an indication of the memory address associated with an error at adjacent bit locations. That is, the memory device 310 may identify a memory address associated with a double bit error (e.g., where two memory cells are shorted together). The indication of the location may be encoded to be fewer bits than the quantity of bits used to communicate a full memory address of the location of the error. Each memory cell in a memory device has a memory address, however, that memory address may be include any quantity of bits. Table 1 illustrates an example of an encoding scheme for indicating a location of an error when testing sixty-four (64) memory cells. The indication is four bits, which is less than the quantity of bits used to communicate a full memory address of any of the memory cells.

The memory device 310 may send the memory addresses identified with the one or more errors to an encoder circuit (e.g., encoder 220 as described with reference to FIG. 1). The encoder may then encode the memory locations into a set of bits that represent the indication of the location. In some examples, the indication may be an example of a location of the one or more errors relative to the test data in a particular portion of the test operation. Additionally or alternatively, the memory device 310 may generate a flag that indicates whether a single bit or a double bit error occurred during the testing operation. The flag may indicate whether a single bit or double bit error occurred and be the first bit in the set of bits. By encoding the memory addresses, the memory device 310 may reduce the amount of test data outputted to the tester 305. For example, when each column tested in the column plane includes 8 memory cells (e.g., 8 bits of data), the following table (e.g., Table 1) may be one example of how the encoding scheme may be implemented. Rows 1-8 of test data in Table 1 represent single errors in the test data and the corresponding indication of the location. Rows 9-15 of test data in Table 1 represent double errors in the test data and the corresponding indication of the location. Row 16 represents the indication for all other types of errors, or an absence of an error. The error flag (not shown in Table 1) may be used in combination with the location indication to determine whether the indication in Row 16 indicates that no errors have occurred or whether a different error has occurred.

have been detected and when the bit L1 has a value one (1) a double bit error may have been detected. The additional bits L2 through L4 may be implemented to indicate the bit location of the error.

In this example, when each column includes eight (8) memory cells (e.g., 8 bits of data), there may be eight (8) single bit error possibilities and seven (7) double bit error possibilities (e.g., when the double bit errors are in adjacent components). In some examples, there may be additional errors that were detected during the test operation (e.g., an error at the first (bit 0) and eighth (bit 7) bit locations) beyond the fifteen (15) possibilities. In such cases, the memory device 310 may encode the locations and generate a set of bits L1 through L4 that all have a value one (1). In other examples, the memory device 310 may detect an absence of errors in the memory array. In such cases, the memory device 310 generate a set of bits L1 through L4 that all have a value (1). In some examples, the memory device 310 may implement the error flag generated at the compressor to distinguish between the possibilities of the bits L1 through L4 having a value one (1) being either multiple error

TABLE 1

| Test Data | | | | | | | | Location Indication | | | |
|---|---|---|---|---|---|---|---|---|---|---|---|
| Bit 7 | Bit 6 | Bit 5 | Bit 4 | Bit 3 | Bit 2 | Bit 1 | Bit 0 | L1 | L2 | L3 | L4 |
| 0 | 0 | 0 | 0 | 0 | 0 | 0 | 1 | 0 | 0 | 0 | 0 |
| 0 | 0 | 0 | 0 | 0 | 0 | 1 | 0 | 0 | 0 | 0 | 1 |
| 0 | 0 | 0 | 0 | 0 | 1 | 0 | 0 | 0 | 0 | 1 | 0 |
| 0 | 0 | 0 | 0 | 1 | 0 | 0 | 0 | 0 | 0 | 1 | 1 |
| 0 | 0 | 0 | 1 | 0 | 0 | 0 | 0 | 0 | 1 | 0 | 0 |
| 0 | 0 | 1 | 0 | 0 | 0 | 0 | 0 | 0 | 1 | 0 | 1 |
| 0 | 1 | 0 | 0 | 0 | 0 | 0 | 0 | 0 | 1 | 1 | 0 |
| 1 | 0 | 0 | 0 | 0 | 0 | 0 | 0 | 0 | 1 | 1 | 1 |
| 0 | 0 | 0 | 0 | 0 | 0 | 1 | 1 | 1 | 0 | 0 | 0 |
| 0 | 0 | 0 | 0 | 0 | 1 | 1 | 0 | 1 | 0 | 0 | 1 |
| 0 | 0 | 0 | 0 | 1 | 1 | 0 | 0 | 1 | 0 | 1 | 0 |
| 0 | 0 | 0 | 1 | 1 | 0 | 0 | 0 | 1 | 0 | 1 | 1 |
| 0 | 0 | 1 | 1 | 0 | 0 | 0 | 0 | 1 | 1 | 0 | 0 |
| 0 | 1 | 1 | 0 | 0 | 0 | 0 | 0 | 1 | 1 | 0 | 1 |
| 1 | 1 | 0 | 0 | 0 | 0 | 0 | 0 | 1 | 1 | 1 | 0 |
| All Other Possibilities | | | | | | | | 1 | 1 | 1 | 1 |

Bit 0 through bit 7 may represent the bit locations of the subset of data. That is, bit 0 may correspond to the first bit location, bit 1 may represent the second bit location, and so forth. A logic value one (1) at the bit locations may represent that an error occurred at the respective bit location. For example, when bit 0 is represented by a logic value 1, an error may have occurred at the first bit location during the testing operation. In some examples, the memory device 310 may identify a double bit error. The double bit error may be represented by adjacent logic value ones (1 s) in Table 1. For example, when the double bit error occurs at the first bit location and the second bit location (e.g., a first and second memory cell are shorted together), bit 0 and bit 1 may both have a value of one (1).

Based on the location of the error, the memory device 310 may generate a set of bits L1 through L4 at the encoder that represent the encoded location associated with the error detected during the testing operation. For example, when L1 through L4 are all zero (0), it may represent a location associated with an error at the first bit location (e.g., at the first memory cell of the first column). In this example, bit L1 may represent the flag generated by the memory device 310 to indicate whether the one or more errors during the test operation include a single bit or a double bit error. That is, when the bit L1 has a value zero (0) a single bit error may or an absence of errors. That is, when the error flag has a value zero (0) and the set of bits L1 through L4 have a value one (1), there may be an absence of errors detected during the test operation. In contrast, when the error flag has a value one (1) and the set of bits L1 through L4 have a value one (1), there may be additional errors detected during the test operation beyond the fifteen (15) possibilities represented in Table 1.

In other examples, the memory device 310 may have columns that include more than or less than eight (8) memory cells. In such cases, the memory device 310 may implement a different encoding scheme, use more than or less than four (4) bits of data to encode the locations, and so forth. That is, these and any other specific encoding examples herein are merely examples provided solely for clarity in explanation and are not limiting on the claims.

At 340, the error flag and the indication of the location may be outputted. For example, the memory device 310 may output the indication of the location of the one or more errors (e.g., the set of bits L1 through L4) and the error flag generated to the tester 305. The tester 305 may receive the indication of the location and the error flag at a processor (e.g., the processor 225 as described with reference to FIG. 2). The processor may send the error flag and the indication of the location to a testing manager (e.g., testing manager 230 as described with reference to FIG. 2).

At 345, a repair solution may be generated. For example, the tester 305 may use the error flag received at the testing manager to generate the repair solution. The tester 305 may generate the repair solution to fix the one or more errors detected in the memory device 310 during the test operation. The memory device 310 may be repaired based on the repair solution generated by the tester 305. The repair solution may include identifying one or more redundant parts of the memory array to use in place of the portion of the memory array with the one or more errors.

At 350, an error report may be generated. For example, the tester 305 may use the indication of the location of the one or more errors received at the testing manager to generate the error report. The tester 305 may generate the error report to perform an analysis of the error detected during the test operation. The tester 305 may generate the error report after receiving multiple indications of a location generated during multiple test operations. The error report may be implemented to refine memory device designs or fabrication processes to ensure the error detected in the test operations are less likely to occur in future productions of the memory device 310.

By generating the error flag and the indication of the location of the one or more errors, the memory device 310 may reduce the size of the test data outputted to the tester 305. Additionally, including the indication of the location may decrease the loss of information associated with a compression method. Including the indication of the location and the error flag may also increase the ability to verify or refine memory device designs or fabrication processes as described above and elsewhere herein.

Figure 4:
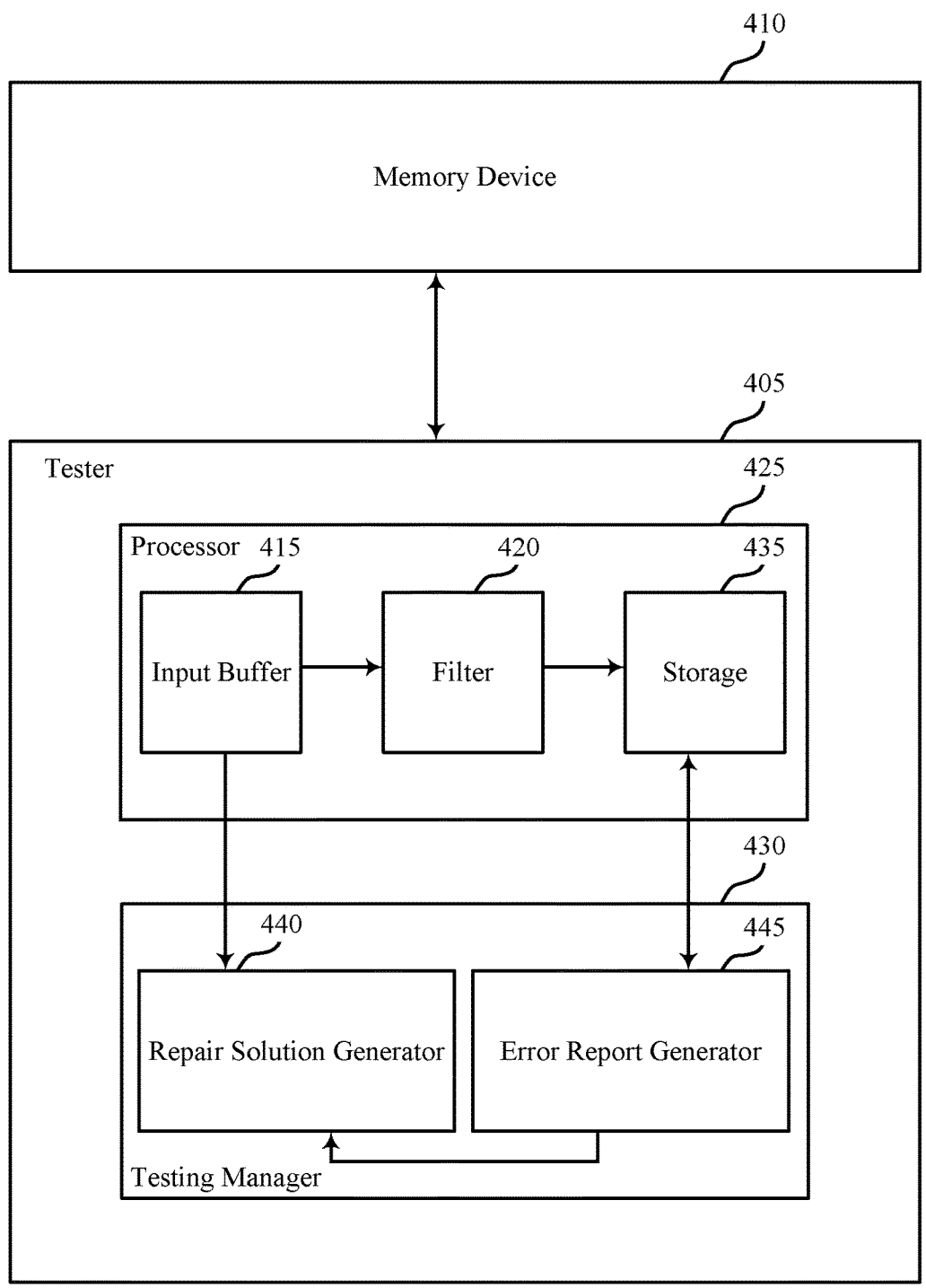
FIG. 4 illustrates an example of a testing setup that supports a compression method for defect visibility in a memory device in accordance with examples as disclosed herein.

FIG. 4 illustrates an example of a testing setup 400 that supports a compression method for defect visibility in a memory device in accordance with examples as disclosed herein. Testing setup 400 may include aspects of FIGS. 1-3. For example, the memory device 410 may be an example of memory device 210 as described with reference to FIG. 2. Tester 405 may be an example of tester 205 as described with reference to FIG. 2. The tester 405 may be coupled with memory device 410. The tester 405 may include a processor 425 (e.g., processor 225 as described with reference to FIG. 1) and a testing manager 430. (e.g., testing manager 230 as described with reference to FIG. 2). Processor 425 may include an input buffer 415, a filter 420, and a storage 435. The testing manager 430 may include a repair solution generator 440 and an error report generator 445.

Input buffer 415 may be configured to receive test data from the memory device 410. For example, input buffer 415 may receive an error flag and an indication of a location of one or more errors from the memory device 410 during a test operation. In some examples, the input buffer 415 may send the error flag to the repair solution generator 440. The input buffer 415 may also output the indication of the location to the filter 420.

The filter 420 may be configured to filter out redundant indications of a location. For example, the filter 420 may receive the indication of the location of the one or more errors from the input buffer 415. The filter 420 may receive a plurality of indications of locations when the tester 405 performs a plurality of test operations. The filter 420 may be configured compare each indication of a location received with a prior indication of a location received. In some examples, the filter 420 may receive an indication of a location that is different than prior indications of locations received and send the indication to the storage 435. In other examples, the filter 420 may receive an indication of a location that is the same as a prior indication of a location received and refrain from sending the indication to the storage 435. When identifying a location of an error, the tester 405 may use the indication of the location within the set of test data and other information about from where in the memory array this test data was generated. Using such information, the tester 405 may be able to identify a full memory address for the one or more errors using the indication of the location and the other information associated with test data.

The storage 435 may be configured to receive an indication of a location from filter 420 and store the indication. The storage 435 may have a relatively small storage capacity and may be unable to receive a large amount of test data. The storage 435 may also be configured to output the indication of the location to the error report generator 445.

The repair solution 440 may be configured to receive an error flag from the input buffer 415. The repair solution 440 may be further configured to generate a repair solution based on receiving the error flag. As described with reference to FIG. 3 and herein, the repair solution generator 440 may generate the repair solution to fix the one or more errors detected in the memory device 410 during the test operation.

The error report generator 445 may be configured to receive an indication of a location of one or more errors from the storage 435. The error report generator 445 may further be configured to decode the indication of a location to identify a memory address associated with the one or more errors in the memory device 410. In some examples, the error report generator 445 may generate an error report after receiving a plurality of indications of locations associated with errors in the memory device 410 based on the tester 405 initiating a plurality of test operations. The error report generator 445 may be configured to generate error reports that are utilized to refine memory device designs or fabrication processes to ensure the error detected in the test operations are less likely to occur in future productions of the memory device 410.

A memory device 410 may be tested during a manufacturing process. The memory device 410 may generate an error flag and an indication of a location of one or more errors detected during the test operation to reduce the size of test data outputted to the tester 405. The memory device 410 may then output the error flag and indication of the location to the tester 405. The input buffer 415 may receive the error flag and the indication of the location from the memory device 410. The input buffer 415 may separate the error flag from the indication of the location (e.g., the set of bits L1 though L4). In some examples, the input buffer 415 may output the error flag to the repair solution generator 440. The repair solution generator 440 may identify if one or more errors occurred during the test operation based on receiving the error flag. That is, the repair solution generator 440 may identify that an error occurred when the error flag has a value one (1) and determine an absence of errors in the memory device 410 when the error flag has a value zero (0). In cases where the error flag has value one (1), the repair solution generator 440 may generate a repair solution to fix the errors detected in the memory device 410. The repair solution generator 440 may generate a repair solution each time an error flag with a value one (1) is received. In other examples, the repair solution generator 440 may refrain from generating a repair solution when the error flag has a value zero (0).

In some examples, the input buffer 415 may output the indication of the location to the filter 420. The filter 420 may compare the received indication of the location with previously received indications of locations. For example, the filter 420 may receive a first indication of a location (e.g., bits L1 through L4 may all have a value zero (0)) during a first test operation of a first column plane initiated by the tester 405. The filter 420 may output this first indication to the storage 435. The filter 420 may then receive a second indication of a location (e.g., bits L1 through L4 may have a value 0, 0, 0, 1 respectively) during a second test operation of the column plane initiated by the tester 405. The filter 420 may compare the first location with the second location and determine that the first location is different than the second location. The filter 420 may send the second indication to the storage 435 based on the determining the second location is different. In some examples, the filter 420 may then receive a third indication of a location (e.g., bits L1 through L4 may all have a value zero (0)) during a third test operation of the column plane initiated by the tester 405. The filter 420 may then compare the third location with the first location and the second location received and stored at the storage 435. The filter 420 may determine that the third location is the same as the first location and refrain from outputting the third indication to the storage 435. That is, because the location of the third indication is already stored in the storage 435, the tester 405 may refrain from storing redundant locations to avoid exceeding the capacity of storage 435.

The storage 435 may also output each indication of a location stored to the error report generator 445. The error report generator 445 may decode the set of bits included in each indication of a location to identify a memory address associated with the one or more errors. For example, when the set of bits in the indication of the location have a value zero (0), zero (0), zero (0), one (1) respectively, the error report generator 445 may identify that the error occurred in the second bit location (e.g., at bit 1 of Table 1). The error report generator 445 may also identify if a single bit or a double bit error occurred by decoding a flag included in the indication of the location. For example, as described with reference to FIG. 3 and herein, the flag may be the first bit of the set of bits that indicates a single bit error when having a value zero (0) and a double bit error when having a value one (1). The error report generator 445 may also generate an error report after the tester performs a determined quantity of testing operations (e.g., a predetermined quantity). Using the locations of the errors may enable the error report generator 445 to generate an error report that analyzes or refines memory device designs or fabrication processes.

Figure 5:
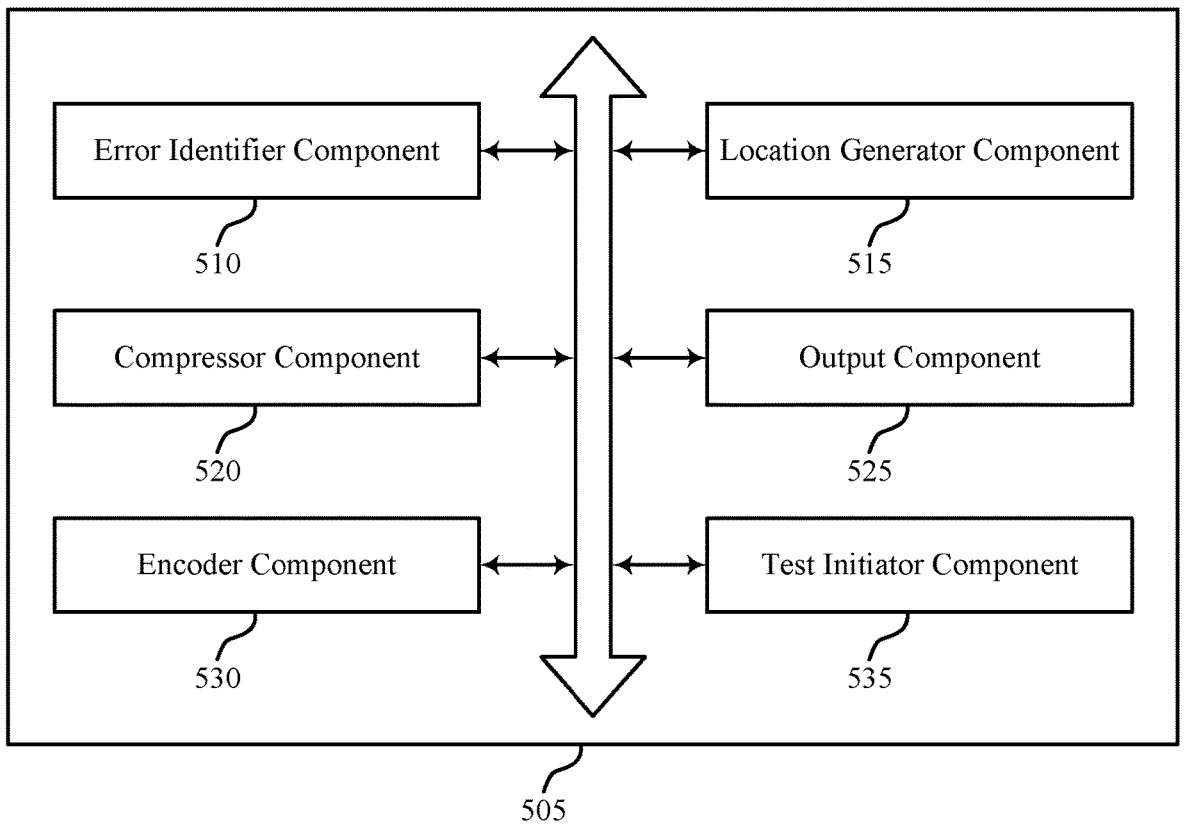
FIG. 5 shows a block diagram of a memory device that supports a compression method for defect visibility in a memory device in accordance with examples as disclosed herein.

By compressing the test data to generate an error flag and generating an indication of a location, the memory device 410 may avoid overflowing the storage 435 of the tester. The indication of the location may also reduce the loss of information resulting from the compression scheme implemented by the memory device 410. That is, including the indication of the location may increase the effectiveness of the test operation and increase the ability to verify or refine memory device designs or fabrication processes FIG. 5 shows a block diagram 500 of a memory device 505 that supports a compression method for defect visibility in a memory device in accordance with examples as disclosed herein. The memory device 505 may be an example of aspects of a memory device as described with reference to FIGS. 1-4. The memory device 505 may include an error identifier component 510, a location generator component 515, a compressor component 520, an output component 525, an encoder component 530, and a test initiator component 535. Each of these modules may communicate, directly or indirectly, with one another (e.g., via one or more buses).

The error identifier component 510 may identify, at a device, one or more errors associated with a first set of memory cells of a memory array of the device based on a first set of data associated with the first set of memory cells. In some examples, the error identifier component 510 may identify whether the one or more errors includes the single-bit error or the multi-bit error, where generating the flag includes identifying whether the one or more errors includes the single-bit error or the multi-bit error.

The location generator component 515 may generate an indication of a location of the one or more errors in the first set of memory cells based on identifying the one or more errors. In some examples, the location generator component 515 may identify one or more addresses of memory cells associated with the one or more errors in the first set of memory cells based on identifying the one or more errors. In some cases, generating a flag indicating whether the one or more errors includes a single-bit error or a multi-bit error is based on identifying the one or more addresses of memory cells associated with the one or more errors, the indication including the flag, where generating the indication is based on generating the flag. In some instances, the location generator component 515 may identify an address of a memory cell associated with at least one of the one or more errors in the first set of memory cells, where generating the indication of the location is based on identifying the address. In some examples, the location generator component 515 may generate a first bit indicating whether the one or more errors includes a single-bit error or a multi-bit error. In some cases, the location generator component 515 may generate one or more second bits indicating the location of the one or more errors.

The compressor component 520 may compress the first set of data to generate an error flag based on identifying the one or more errors. In some examples, the compressor component 520 may compare a first subset of data of the first set of data with a second subset of data of the first set of data using a set of logic circuits, where a first bit at a first bit location of the first subset of data is compared with a second bit at the first bit location of the second subset of data as part of comparing the first subset with the second subset. In some cases, the compressor component 520 may generate, for each bit location of the first subset and the second subset, a comparison bit that indicates whether the first bit of the first subset of data is different than the second bit of the second subset of data based on comparing the first subset of data with the second subset of data. In some instances, the compressor component 520 may compare a first comparison bit at the first bit location with a second comparison bit at a second bit location, where generating the error flag is based on comparing the first comparison bit with the second comparison bit. In some examples, the compressor component 520 may XOR the first bit at the first bit location of the first subset of data with the second bit at the first bit location of the second subset of data.

The output component 525 may output the error flag and the indication of the location based on generating the error flag and generating the indication. In some cases, the output component 525 may output error flag and the indication of the location to a tester.

The encoder component 530 may encode the one or more addresses to generate a set of bits corresponding to the location based on identifying the one or more addresses, where generating the indication of the location is based on encoding the one or more addresses.

The test initiator component 535 may initialize a test operation at the device. In some examples, the test initiator component 535 may identify a set of memory addresses associated to test as part of the test operation based on initializing the test operation. In some cases, the test initiator component 535 may scramble the set of memory addresses based on identifying the set of memory addresses, where identifying the one or more errors is based on scrambling the set of memory addresses.

Figure 6:
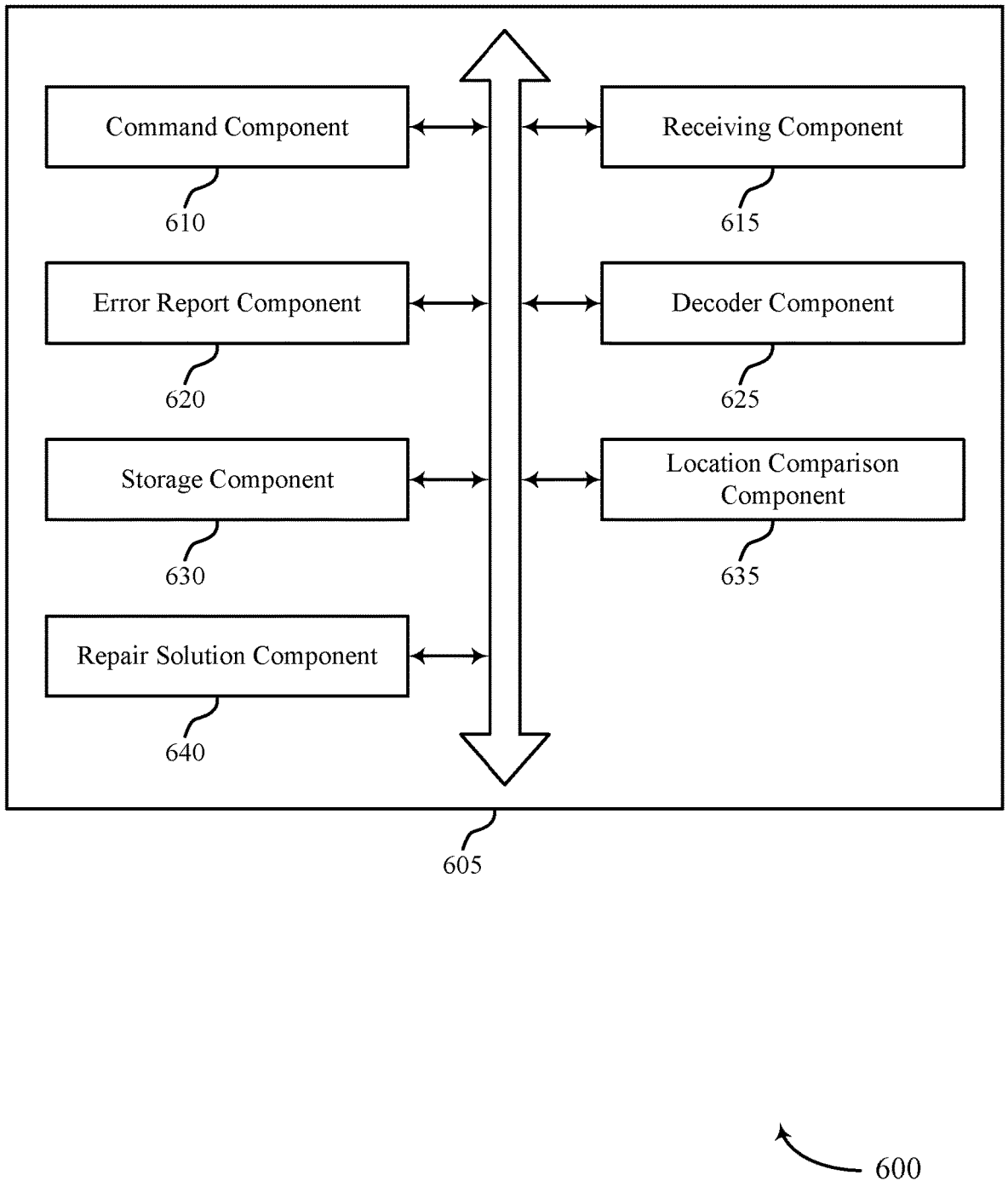
FIG. 6 shows a block diagram of a tester that supports a compression method for defect visibility in a memory device in accordance with examples as disclosed herein.

FIG. 6 shows a block diagram 600 of a tester 605 that supports a compression method for defect visibility in a memory device in accordance with examples as disclosed herein. The tester 605 may be an example of aspects of a tester as described with reference to FIGS. 2-4. The tester 605 may include a command component 610, a receiving component 615, an error report component 620, a decoder component 625, a storage component 630, a location comparison component 635, and a repair solution component 640. Each of these modules may communicate, directly or indirectly, with one another (e.g., via one or more buses).

The command component 610 may transmit, to a device, a command to perform a test of a first set of memory cells of a memory array of the device. In some examples, the command component 610 may transmit, to the device, a second command to perform a second test of a second set of memory cells in the memory array of the device. In some cases, the command component 610 may transmit, to the device, a third command to perform a third test of a third set of memory cells in the memory array of the device.

The receiving component 615 may receive, from the device based on transmitting the command, a first error flag that one or more errors are associated with the first set of memory cells and a first indication of a location of the one or more errors in the first set of memory cells. In some cases, the receiving component 615 may receive, from the device, a second error flag that one or more errors are associated with the second set of memory cells and a second indication of a second location of the one or more errors in the second set of memory cells based on transmitting the second command. In some instances, the receiving component 615 may receive, from the device, a third error flag that one or more errors are associated with the third set of memory cells and a third indication of a third location of the one or more errors in the third set of memory cells based on transmitting the third command.

The error report component 620 may generate an error report for the one or more errors based on receiving the first error flag and the first indication of the location of the one or more errors for the first set of memory cells.

The decoder component 625 may identify a first bit of the first indication that indicates whether the one or more errors includes a single-bit error or a multi-bit error. In some examples, the decoder component 625 may identify one or more second bits of the first indication that indicates the location of the one or more errors, where generating the error report is based on identifying the first bit and the one or more second bits. In some cases, the decoder component 625 may decode the first indication of the location based on receiving the first indication. In some instances, the decoder component 625 may identify a memory address associated with the one or more errors based on decoding the first indication, where generating the error report is based on identifying the memory address.

The storage component 630 may store the first indication of the location of the one or more errors based on receiving the first indication. In some cases, the storage component 630 may store the second indication based on determining that the second location is different than the location. In some instances, the storage component 630 may refrain from storing the third indication based on determining that the third location is the same as the location.

The location comparison component 635 may determine that the location indicated by the first indication is different than the second location indicated by the second indication based on receiving the second indication. In some examples, the location comparison component 635 may determine that the third location indicated by the third indication is the same as the location indicated by the first indication or the location of the second indication based on receiving the third indication.

The repair solution component 640 may generate a repair solution for the first set of memory cells based on receiving the first error flag and the first indication.

Figure 7:
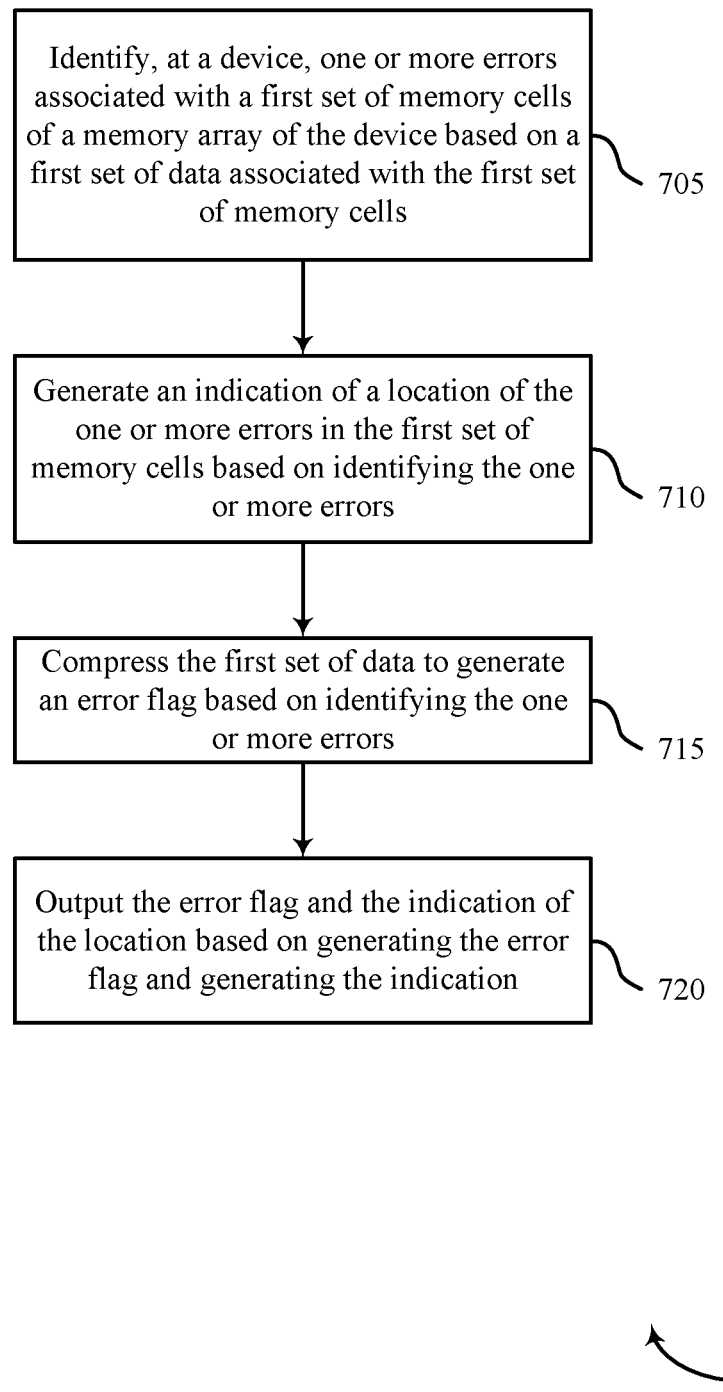
FIGS. 7 and 8 show flowcharts illustrating a method or methods that support a compression method for defect visibility in a memory device in accordance with examples as disclosed herein.

FIG. 7 shows a flowchart illustrating a method or methods 700 that supports a compression method for defect visibility in a memory device in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may identify, at a device, one or more errors associated with a first set of memory cells of a memory array of the device based on a first set of data associated with the first set of memory cells. The operations of 705 may be performed according to the methods described herein. In some examples, aspects of the operations of 705 may be performed by an error identifier component as described with reference to FIG. 5.

At 710, the memory device may generate an indication of a location of the one or more errors in the first set of memory cells based on identifying the one or more errors. The operations of 710 may be performed according to the methods described herein. In some examples, aspects of the operations of 710 may be performed by a location generator component as described with reference to FIG. 5.

At 715, the memory device may compress the first set of data to generate an error flag based on identifying the one or more errors. The operations of 715 may be performed according to the methods described herein. In some examples, aspects of the operations of 715 may be performed by a compressor component as described with reference to FIG. 5.

At 720, the memory device may output the error flag and the indication of the location based on generating the error flag and generating the indication. The operations of 720 may be performed according to the methods described herein. In some examples, aspects of the operations of 720 may be performed by an output component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for identifying, at a device, one or more errors associated with a first set of memory cells of a memory array of the device based on a first set of data associated with the first set of memory cells, generating an indication of a location of the one or more errors in the first set of memory cells based on identifying the one or more errors. The apparatus may further include features, means, or instructions for compressing the first set of data to generate an error flag based on identifying the one or more errors, and outputting the error flag and the indication of the location based on generating the error flag and generating the indication.

Some cases of the method 700 and the apparatus described herein may further include operations, features, means, or instructions for identifying one or more addresses of memory cells associated with the one or more errors in the first set of memory cells based on identifying the one or more errors, and encoding the one or more addresses to generate a set of bits corresponding to the location based on identifying the one or more addresses, where generating the indication of the location may be based on encoding the one or more addresses.

Some instances of the method 700 and the apparatus described herein may further include operations, features, means, or instructions for generating a flag indicating whether the one or more errors includes a single-bit error or a multi-bit error, the indication including the flag, where generating the indication may be based on generating the flag.

Some examples of the method 700 and the apparatus described herein may further include operations, features, means, or instructions for identifying whether the one or more errors includes the single-bit error or the multi-bit error, where generating the flag includes identifying whether the one or more errors includes the single-bit error or the multi-bit error.

In some cases of the method 700 and the apparatus described herein, the indication may include operations, features, means, or instructions for a first bit indicating whether the one or more errors includes a single-bit error or a multi-bit error, and one or more second bits indicating the location of the one or more errors.

In some instances of the method 700 and the apparatus described herein, compressing the first set of data to generate the error flag may include operations, features, means, or instructions for comparing a first subset of data of the first set of data with a second subset of data of the first set of data using a set of logic circuits, where a first bit at a first bit location of the first subset of data may be compared with a second bit at the first bit location of the second subset of data as part of comparing the first subset with the second subset, and generating, for each bit location of the first subset and the second subset, a comparison bit that indicates whether the first bit of the first subset of data may be different than the second bit of the second subset of data based on comparing the first subset of data with the second subset of data.

Some examples of the method 700 and the apparatus described herein may further include operations, features, means, or instructions for comparing a first comparison bit at the first bit location with a second comparison bit at a second bit location, where generating the error flag may be based on comparing the first comparison bit with the second comparison bit.

In some cases of the method 700 and the apparatus described herein, comparing the first subset with the second subset may include operations, features, means, or instructions for XORing the first bit at the first bit location of the first subset of data with the second bit at the first bit location of the second subset of data.

Some instances of the method 700 and the apparatus described herein may further include operations, features, means, or instructions for initializing a test operation at the device, identifying a set of memory addresses associated to test as part of the test operation based on initializing the test operation, and scrambling the set of memory addresses based on identifying the set of memory addresses, where identifying the one or more errors may be based on scrambling the set of memory addresses.

Some examples of the method 700 and the apparatus described herein may further include operations, features, means, or instructions for identifying an address of a memory cell associated with at least one of the one or more errors in the first set of memory cells, where generating the indication of the location may be based on identifying the address.

In some cases of the method 700 and the apparatus described herein, the error flag and the indication of the location may be output to a tester.

Figure 8:
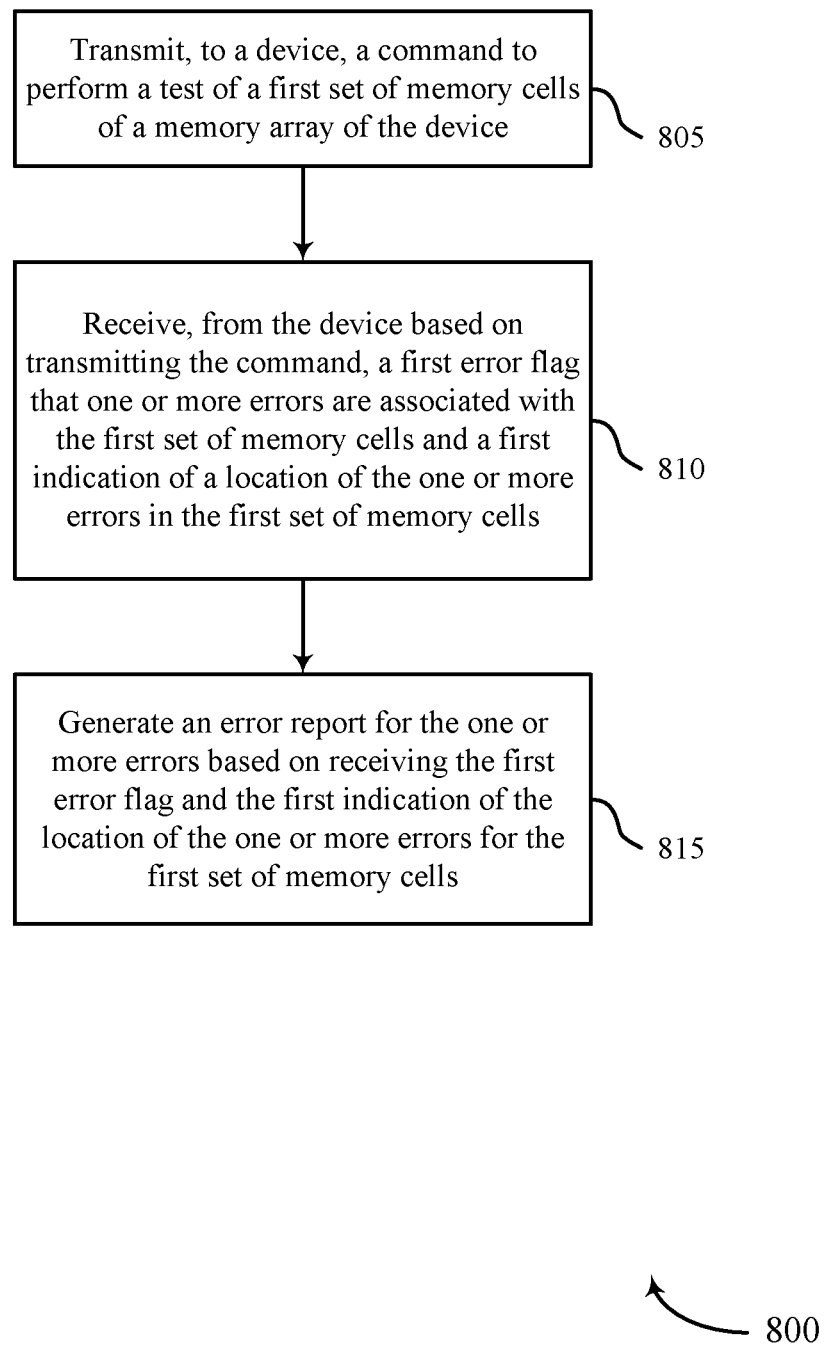

FIG. 8 shows a flowchart illustrating a method or methods 800 that supports a compression method for defect visibility in a memory device in accordance with examples as disclosed herein. The operations of method 800 may be implemented by a tester or its components as described herein. For example, the operations of method 800 may be performed by a tester as described with reference to FIG. 6. In some examples, a tester may execute a set of instructions to control the functional elements of the tester to perform the described functions. Additionally or alternatively, a tester may perform aspects of the described functions using special-purpose hardware.

At 805, the tester may transmit, to a device, a command to perform a test of a first set of memory cells of a memory array of the device. The operations of 805 may be performed according to the methods described herein. In some examples, aspects of the operations of 805 may be performed by a command component as described with reference to FIG. 6.

At 810, the tester may receive, from the device based on transmitting the command, a first error flag that one or more errors are associated with the first set of memory cells and a first indication of a location of the one or more errors in the first set of memory cells. The operations of 810 may be performed according to the methods described herein. In some examples, aspects of the operations of 810 may be performed by a receiving component as described with reference to FIG. 6.

At 815, the tester may generate an error report for the one or more errors based on receiving the first error flag and the first indication of the location of the one or more errors for the first set of memory cells. The operations of 815 may be performed according to the methods described herein. In some examples, aspects of the operations of 815 may be performed by an error report component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for transmitting, to a device, a command to perform a test of a first set of memory cells of a memory array of the device, receiving, from the device based on transmitting the command, a first error flag that one or more errors are associated with the first set of memory cells and a first indication of a location of the one or more errors in the first set of memory cells, and generating an error report for the one or more errors based on receiving the first error flag and the first indication of the location of the one or more errors for the first set of memory cells.

Some examples of the method 800 and the apparatus described herein may further include operations, features, means, or instructions for identifying a first bit of the first indication that indicates whether the one or more errors includes a single-bit error or a multi-bit error, and identifying one or more second bits of the first indication that indicates the location of the one or more errors, where generating the error report may be based on identifying the first bit and the one or more second bits.

Some cases of the method 800 and the apparatus described herein may further include operations, features, means, or instructions for storing the first indication of the location of the one or more errors based on receiving the first indication.

Some instances of the method 800 and the apparatus described herein may further include operations, features, means, or instructions for transmitting, to the device, a second command to perform a second test of a second set of memory cells in the memory array of the device, receiving, from the device, a second error flag that one or more errors may be associated with the second set of memory cells and a second indication of a second location of the one or more errors in the second set of memory cells based on transmitting the second command, determining that the location indicated by the first indication may be different than the second location indicated by the second indication based on receiving the second indication, and storing the second indication based on determining that the second location may be different than the location.

Some examples of the method 800 and the apparatus described herein may further include operations, features, means, or instructions for transmitting, to the device, a third command to perform a third test of a third set of memory cells in the memory array of the device, receiving, from the device, a third error flag that one or more errors may be associated with the third set of memory cells and a third indication of a third location of the one or more errors in the third set of memory cells based on transmitting the third command, determining that the third location indicated by the third indication may be the same as the location indicated by the first indication or the location of the second indication based on receiving the third indication, and refraining from storing the third indication based on determining that the third location may be the same as the location.

Some cases of the method 800 and the apparatus described herein may further include operations, features, means, or instructions for generating a repair solution for the first set of memory cells based on receiving the first error flag and the first indication.

Some instances of the method 800 and the apparatus described herein may further include operations, features, means, or instructions for decoding the first indication of the location based on receiving the first indication, and identifying a memory address associated with the one or more errors based on decoding the first indication, where generating the error report may be based on identifying the memory address.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array, an encoder coupled with the memory array and operable to encode one or more memory address by generating a set of bits corresponding to a location, a memory controller coupled with the memory array and configured to cause the apparatus to, generate an indication of a location of the one or more errors in the first set of memory cells based on identifying the one or more errors, compress the first set of data to generate an error flag based on identifying the one or more errors, and output the error flag and the indication of the location based on generating the error flag and generating the indication.

In some cases, the controller may be further configured to generate a flag indicating whether the one or more errors includes a single-bit error or a multi-bit error, the indication including the flag, where the memory controller may be configured to generate the indication based on generating the flag.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
identifying, at a device, one or more errors associated with a first set of memory cells of a memory array of the device based at least in part on a first set of data associated with the first set of memory cells, wherein identifying the one or more errors is based at least in part on scrambling a plurality of addresses associated with a test operation;
generating an indication of a location of the one or more errors in the first set of memory cells based at least in part on identifying the one or more errors;
compressing the first set of data to generate an error flag based at least in part on identifying the one or more errors; and
outputting the error flag and the indication of the location based at least in part on generating the error flag and generating the indication.

2. The method of claim 1, further comprising:
identifying one or more addresses of memory cells associated with the one or more errors in the first set of memory cells based at least in part on identifying the one or more errors; and
encoding the one or more addresses to generate a set of bits corresponding to the location based at least in part on identifying the one or more addresses, wherein generating the indication of the location is based at least in part on encoding the one or more addresses.

3. The method of claim 1, further comprising:
generating a flag indicating whether the one or more errors comprises a single-bit error or a multi-bit error, the indication comprising the flag, wherein generating the indication is based at least in part on generating the flag.

4. The method of claim 3, further comprising:
identifying whether the one or more errors comprises the single-bit error or the multi-bit error, wherein generating the flag comprises identifying whether the one or more errors comprises the single-bit error or the multi-bit error.

5. The method of claim 1, wherein the indication comprises:
a first bit indicating whether the one or more errors comprises a single-bit error or a multi-bit error; and
one or more second bits indicating the location of the one or more errors.

6. The method of claim 1, wherein compressing the first set of data to generate the error flag comprises:
comparing a first subset of data of the first set of data with a second subset of data of the first set of data using a plurality of logic circuits, wherein a first bit at a first bit location of the first subset of data is compared with a second bit at the first bit location of the second subset of data as part of comparing the first subset with the second subset; and
generating, for each bit location of the first subset and the second subset, a comparison bit that indicates whether the first bit of the first subset of data is different than the second bit of the second subset of data based at least in part on comparing the first subset of data with the second subset of data.

7. The method of claim 6, further comprising:
comparing a first comparison bit at the first bit location with a second comparison bit at a second bit location, wherein generating the error flag is based at least in part on comparing the first comparison bit with the second comparison bit.

8. The method of claim 6, wherein comparing the first subset with the second subset comprises:
XORing the first bit at the first bit location of the first subset of data with the second bit at the first bit location of the second subset of data.

9. The method of claim 1, further comprising:
identifying an address of a memory cell associated with at least one of the one or more errors in the first set of memory cells, wherein generating the indication of the location is based at least in part on identifying the address.

10. The method of claim 1, wherein the error flag and the indication of the location are output to a tester.

11. A method comprising:
identifying, at a device, one or more errors associated with a first set of memory cells of a memory array of the device based at least in part on a first set of data associated with the first set of memory cells;
generating an indication of a location of the one or more errors in the first set of memory cells based at least in part on identifying the one or more errors;
compressing the first set of data to generate an error flag based at least in part on identifying the one or more errors;
outputting the error flag and the indication of the location based at least in part on generating the error flag and generating the indication;
initializing a test operation at the device;
identifying a plurality of addresses to test as part of the test operation based at least in part on initializing the test operation; and
scrambling the plurality of addresses based at least in part on identifying the plurality of addresses, wherein identifying the one or more errors is based at least in part on scrambling the plurality of addresses.

12. A method, comprising:
transmitting, to a device, a command to perform a test of a first set of memory cells of a memory array of the device, wherein the test comprises scrambling a plurality of addresses associated with the test;
receiving, from the device based at least in part on transmitting the command, a first error flag that one or more errors are associated with the first set of memory cells and a first indication of a location of the one or more errors in the first set of memory cells;
generating an error report for the one or more errors based at least in part on receiving the first error flag and the first indication of the location of the one or more errors for the first set of memory cells; and
generating a repair solution for the first set of memory cells based at least in part on receiving the first error flag and the first indication.

13. The method of claim 12, further comprising:
identifying a first bit of the first indication that indicates whether the one or more errors comprises a single-bit error or a multi-bit error; and
identifying one or more second bits of the first indication that indicates the location of the one or more errors, wherein generating the error report is based at least in part on identifying the first bit and the one or more second bits.

14. The method of claim 12, further comprising:
storing the first indication of the location of the one or more errors based at least in part on receiving the first indication.

15. The method of claim 12, further comprising:
transmitting, to the device, a second command to perform a second test of a second set of memory cells in the memory array of the device;
receiving, from the device, a second error flag that one or more errors are associated with the second set of memory cells and a second indication of a second location of the one or more errors in the second set of memory cells based at least in part on transmitting the second command;
determining that the location indicated by the first indication is different than the second location indicated by the second indication based at least in part on receiving the second indication; and
storing the second indication based at least in part on determining that the second location is different than the location.

16. The method of claim 15, further comprising:
transmitting, to the device, a third command to perform a third test of a third set of memory cells in the memory array of the device;
receiving, from the device, a third error flag that one or more errors are associated with the third set of memory cells and a third indication of a third location of the one or more errors in the third set of memory cells based at least in part on transmitting the third command;
determining that the third location indicated by the third indication is the same as the location indicated by the first indication or the location of the second indication based at least in part on receiving the third indication; and
refraining from storing the third indication based at least in part on determining that the third location is the same as the location.

17. The method of claim 12, further comprising:
decoding the first indication of the location based at least in part on receiving the first indication; and
identifying a memory address associated with the one or more errors based at least in part on decoding the first indication, wherein generating the error report is based at least in part on identifying the memory address.

18. An apparatus, comprising:
a memory array,
an encoder coupled with the memory array and operable to encode one or more addresses by generating a set of bits corresponding to a location, and
a memory controller coupled with the memory array and configured to cause the apparatus to:
identify one or more errors associated with a first set of memory cells of the memory array based at least in part on a first set of data associated with the first set of memory cells, wherein identifying the one or more errors is based at least in part on scrambling a plurality of addresses associated with a test operation;
generate an indication of the location of the one or more errors in the first set of memory cells based at least in part on identifying the one or more errors;
compress the first set of data to generate an error flag based at least in part on identifying the one or more errors; and
output the error flag and the indication of the location based at least in part on generating the error flag and generating the indication.

19. The apparatus of claim 18, wherein the memory controller is further configured to cause the apparatus to:
generate a flag indicating whether the one or more errors comprises a single-bit error or a multi-bit error, the indication comprising the flag, wherein the memory controller is configured to generate the indication based at least in part on generating the flag.

* * * * *